United States Patent [19]
Zega

[11] 4,112,137
[45] Sep. 5, 1978

[54] PROCESS FOR COATING INSULATING SUBSTRATES BY REACTIVE ION PLATING

[75] Inventor: Bogdan Zega, Geneva, Switzerland

[73] Assignee: Battelle Memorial Institute, Carouge-Geneva, Switzerland

[21] Appl. No.: 741,783

[22] Filed: Nov. 15, 1976

[30] Foreign Application Priority Data

Nov. 19, 1975 [CH] Switzerland ............ 15019/75

[51] Int. Cl.² ........................... B05D 3/06
[52] U.S. Cl. ................ 427/38; 219/121 EB; 427/42
[58] Field of Search ............ 427/38, 39, 40, 42; 219/121 EB

[56] References Cited

U.S. PATENT DOCUMENTS

| 848,600 | 3/1907 | von Pirani | 219/121 EB |
|---|---|---|---|
| 3,492,152 | 1/1970 | Cariou et al. | 427/250 |
| 3,562,141 | 2/1971 | Morley | 204/298 |
| 3,634,647 | 1/1972 | Dale | 219/121 EB |
| 3,912,462 | 10/1975 | Balthis et al. | 427/42 |

FOREIGN PATENT DOCUMENTS

1,065,745 4/1967 United Kingdom.

OTHER PUBLICATIONS

Murayama, "J. Vac. Sci. Tech.", v. 12, #4, Jul./Aug. 1975, pp. 818–820.

*Primary Examiner*—John H. Newsome
*Attorney, Agent, or Firm*—Karl F. Ross

[57] ABSTRACT

An insulating substrate, such as a glass windscreen, is coated with a conductive coating of an oxide of at least one metal by a process in which the substrate is subjected, in a rarefied oxygen atmosphere, to metal ions and oxygen ions arising from bombardment of a metal source with an electron beam and the proximity to the substrate of a negatively biased grid serving to accelerate the metal ions to the substrate where they combine with oxygen to form an oxide coating.

14 Claims, 3 Drawing Figures

PROCESS FOR COATING INSULATING SUBSTRATES BY REACTIVE ION PLATING

FIELD OF THE INVENTION

My present invention relates to a process for providing insulating substrates, particularly transparent ones, with electrically conductive metal-oxide coatings.

BACKGROUND OF THE INVENTION

The industrial production of conducting coatings on transparent large-area supports, such as vehicle windows, having high optical transmissivity and low electrical resistivity, particularly to enable the transparent supports to be electrically heated, constitutes a problem which has still not been satisfactorily solved.

The oldest known method for making a glass surface conducting consists in depositing a coating of tin oxide ($SnO_2$) on the glass by chemical means, for example by atomizing a solution containing tin chloride onto the glass heated to 400°–500° C. However, coatings thus obtained are of relatively low conductivity. It is known to considerably increase the conductivity of these coatings by adding to them a dope in the form of an oxide of a higher valency ($Sb_2O_5$) or a lower valency ($In_2O_3$). However, in spite of the possible improvements, this method of deposition by chemical means presents a certain number of disadvantages, including the toxicity of the products used or the fumes produced and the difficulty of obtaining uniform reproducible deposits.

Other conventional methods involve depositing the conducting oxide or oxide mixture by physical processes. For example, sputtering techniques enable the constituent material (oxide) of a target of practically unlimited area to be transferred onto the transparent support, placed a short distance from this target, by ionic bombardment produced by glass discharge in an inert gas (preferably argon), energized by a d-c voltage or a high-frequency (radio frequency) alternating potential. Like results may be obtained by using the reactive-sputtering technique, in which oxygen is added to the argon atmosphere and a target is used consisting of metal or a metal alloy which is pulverized and oxidized on contact with the oxygen, to deposit a coating in the form of conducting oxides on the transparent support. The main advantages of these sputtering techniques are the obtaining of uniform coatings over large areas, and the ability to control the progress of the process by measuring quantities such as the pressure of the gas or gases, the applied voltage and the electric current. However, these techniques have the major disadvantage of giving a very low deposition rate, of the order of 300–500 A/min, which is incompatible with the requirements of mass production.

When using a radio-frequency sputtering method, the resistivity of the indium oxide may be considerably lowered by doping it with tin oxide, the minimum resistivity appearing to be obtained at a composition of 20 Moles $SnO_2$; 80 Moles $In_2O_3$.

Other physical methods for depositing conducting oxide coatings include thermal-evaporation techniques (non-reactive or reactive).

Non-reactive thermal evaporation consists in evaporating the conducting oxide or oxide mixture under vacuum by heating it with an electron beam emitted by an electron gun. The deposition rates thus obtained are very high (of the order of 1 $\mu$m/min), but the deposited coating proves to be under-stoichiometric, and thus strongly brown or black-blue in color. Such a coating remains opalescent even after re-oxidation in the presence of oxygen. Reactive thermal evaporation consists in evaporating the metal (or metals) under low-pressure of oxygen, the metal being heated by the same evaporation source. However, the deposition rate is limited in such a method by the maximum allowable oxygen pressure. As the probability of oxidation of the metal atoms in the path between the source and the substrate increases with the oxygen pressure in the enclosure, in theory one should be able to obtain high deposition rates by increasing this pressure. However, considerable increase in pressure is impossible in practice, as the pressure limits the mean free path of the atoms/molecules because of the collisions which arise, and which favor nucleation, i.e. condensation of the material already in the gaseous phase, thus giving rise to pulverulent opalescent deposits. In practice, the maximum tolerable oxygen pressure is of the order of $10^{-4}$ torr, and the deposition rates obtained are of the order of a few A/sec.

It is likewise known that, in addition to the aforementioned oxides, there are other compounds which enable transparent conducting coatings to be obtained, such as cadmium stannate. This compound is generally deposited by radio-frequency sputtering.

Finally, it has been recently proposed to deposit indium oxide on glass by radio-frequency reactive-ion plating. This method consists in disposing a coil connected to a high-frequency generator between the indium source and the substrate support, respectively serving as an anode and a cathode, and then introducing low-pressure oxygen (of the order of $8 \times 10^{-4}$ torr) into the enclosure to create a glow discharge, a part of the indium being evaporated by the Joule effect and becoming ionized at the same time by the glow discharge and the high-frequency oscillating field created by the coil, while being accelerated in the direction of the cathode. However, the deposition rates obtained remain low (of the order of 1–3 A/sec) and the indium oxide coatings obtained are of relatively high resistivity (of the order of $1.5 \times 10^{-3}$ $\Omega$.cm). An attempt could be made to reduce this resistivity by making under-stoichiometric deposits, but there is no escaping the reduction in optical transmissivity of the coatings resulting from such deposits. Moreover, the use of resistance heating as the source of evaporation has the great disadvantage of limiting evaporation to small-area sources. As this evaporation takes place in a reactive atmosphere, an oxide film also forms on the surface of the molten metal, tending to stop evaporation which can be achieved only at the price of superheating the crucible to eliminate this oxide film. The elimination of this film results in sudden evaporation of the material, making any control of evaporation rate impossible. Moreover, the use of radio frequencies greatly increases the cost of the process, and it remains limited to coating small surfaces. Finally, the absence of a true cathode in proximity to the substrate poses problems for the initiation of deposition, in particular the lack of ionization and acceleration of the ions at the beginning of deposition, which have repercussions on the quality of the substrate-coating interface.

Large-scale deposition of oxide coatings on large-area transparent supports by the aforementioned reactive methods also requires continuous recharging of the evaporation sources. A certain number of recharging systems are already known. For example, a system is known in which the metal-evaporation source consists of a bar of circular section which traverses the bottom of the enclosure in a sealed manner and which is cooled over the larger part of its length and heated by an electron gun only at its top. Such a system is well adapted to the evaporation of metals which have a melting point close to the evaporation temperature. Another system is also known in which the crucible is continuously recharged with the liquefied metal by feeding it with a wire of the metal, brought close to the crucible by a sheath which guides it subsequently to the feed spool on which it is wound. This system is also limited to metals having a melting point not far removed from the evaporation temperature.

These known recharging systems, however, are difficult to apply to metals such as indium or its alloys with tin and antimony, which have a melting point (less than 150° C) far removed from the evaporation temperature (of the order of 1000° C for a vapor pressure of about $10^{-2}$ torr). With such systems, the metal bar or wire melts prematurely, far from the evaporation region.

OBJECT OF THE INVENTION

The object of my present invention is to provide an improved process for coating an insulating substrate with a preferably conductive oxide layer.

SUMMARY OF THE INVENTION

In accordance with my present invention, at least one crucible serving as a source of a vaporizable metallic mass is disposed in a sealed envelope in whose interior a rarefied atmosphere, at a gas pressure capable of sustaining a glow discharge, is maintained by suitable pump means; the metallic mass is vaporized by training an electron beam upon it, preferably from a cold cathode as more fully discussed hereinafter. A substrate to be coated is supported in the enclosure at a location offset from the origin of the electrode beam, i.e. from the cold cathode, and remote from the vaporizable-metal source; a conductive grid is interposed between that source and the location of the substrate in proximity to the latter. By negatively biasing the grid relatively to the metallic mass, with a voltage sufficient to develop a glow discharge therebetween, I am able to ionize — through the joint action of this discharge and the electron beam — part of the metal vapors emitted by the source and part of the oxygen in the rarefied atmosphere so that the resulting ions interact and are accelerated by the biasing potential toward the substrate to deposit the desired oxide thereon.

Pursuant to a more particular feature of my invention, the cold cathode used to generate the electron beam — upon being bombarded by oxygen ions as a result of another glow discharge set up between that cathode and a surrounding anode — is located outside the region of the glow discharge established between the grid and the vaporizable-metal source, the electron beam being convergently guided by suitable focusing means toward the metallic mass so as to pass through that glow-discharge region in a terminal part of its trajectory. This can be accomplished in various ways, as by letting the beam pass vertically between a pair of grids juxtaposed with respective substrates or by injecting the beam laterally into the aforementioned discharge region. Such an arrangement insures, on the one hand, that the metal vapors and the oxygen are subjected to joint activation by the beam and by the glow discharge and, on the other hand, that their ions are not unduly deviated toward the more remote cathode.

In the present specification, the expression "reactive-ion plating" denotes a method of vacuum deposition designed to form coatings by evaporation-condensation of a metal source inside a sealed enclosure containing a rarefied atmosphere of reactive gas, in the presence of a glow discharge generated by negative biasing of the substrate to be coated (and/or of a grid situated in proximity to this substrate) relative to the enclosure and source.

Thus, it is apparent that the process according to the invention essentially aims at maximum activation of the metal-vapor and oxygen particles by the combined action of the glow discharge generated in the vicinity of the substrate and the electron beam evaporating the metal source, with the object of obtaining oxide coatings of optimum hardness and adherence characteristics.

The generation of a glow discharge in the vicinity of the substrate (by negative biasing of the grid situated in proximity to that substrate) has the effect of causing partial ionization and partial excitation or dissociation both of the constituent atoms of the metal vapor and of the constituent molecules of the rarefied oxygen atmosphere, to bring all these particles into forms which are much more reactive than the initial particles (the expression "particles" here means the assembly of elements present in the gaseous state in the sealed enclosure, whether these elements are in molecular, atomic or ionic form).

The use of an electron beam, besides allowing the metal source to be evaporated, also has a complementary effect analogous to that exerted by the glow discharge, namely the transformation of the oxygen molecules and metal-vapor atoms encountered by the beam in its trajectory into more reactive forms, by similar mechanisms of ionization, excitation and dissociation. The overall increase in particle activity resulting from this joint action of the glow discharge and the electron beam thus provides a much higher degree of oxidation of the deposits, thereby enabling an increase in deposition rate. The particles which have been ionized by the glow discharge or by the electron beam are also strongly accelerated in the direction of the substrate by the effect of the electric field resulting from negative biasing of the grid, so that the mean free path of these particles is greatly increased (free path 30 to 100 times greater than in the absence of this field). This drastic increase in the free path makes it possible to use much higher pressures (of the order of $10^{-3}$ torr) and increased deposition rates (of the order of 20 to 50 A/sec).

Any known type of gun may be used in principle to generate the electron beam capable of heating the evaporation source. However, as the use of a conventional electron gun in the presence of oxygen at $10^{-3}$ torr requires differential pumping to ensure a good vacuum around the hot cathode in order to give it reasonable life, thus contributing to increased bulk and costs, I prefer to use other types of guns. A particularly advantageous method, especially in the presence of an oxygen atmosphere, is to use a cold-cathode glow-discharge electron gun of the "hollow anode" or the "hollow cathode" type. In each of these types, a cold cathode is biased at, say, $-6$ to $-20$ kV and, by virtue of suitable geometry of the cathode and its surroundings, an electron beam is obtained which may be focused or further deflected by magnetic fields and concentrated on the crucible containing the metal (or metals) to be evaporated. The cooled cathode consists preferably of aluminum, which possesses an excellent secondary electron yield especially in the presence of oxygen. This cathode may be flat, or may be of concave surface to give a fixed-focus beam, dependent on the operating voltage. This type of gun also has the advantage of requiring only a simple high-voltage supply, any controlled supply for the cathode heating being superfluous, as is the presence of an isolation transformer. The glow discharge generated by this gun also leads to further growth in the activity of that portion of the rarefied oxygen atmosphere which is situated in proximity to the gun.

The process according to the invention may be used to deposit simple oxide coatings (i.e. coatings comprising only one metal) or mixed-oxide coatings (i.e. oxide coatings comprising at least two metals, the mixed oxides being either solid solutions of oxides of a composition which may vary within a given range, or well defined stoichiometric compounds). The oxides thus deposited may be of very different types. The process according to the invention may be used with particular advantage to deposit coatings of transparent electrically conducting oxides on insulating transparent substrates. These transparent conducting oxide coatings may for example consist of solid solutions of mixed oxides of indium and tin or of indium and antimony, or well defined compounds such as cadmium stannate $Cd_2SnO_4$.

A mixed-oxide coating of two metals of predetermined composition may be deposited by two methods, either by using a single source of evaporation consisting of an alloy of these metals, or by using two independent sources of evaporation each consisting of one of the metals.

In the case of a single source consisting of an alloy of the metals, it is convenient to choose an alloy composition such that for the chosen evaporation temperature T (depending on the evaporation rate required) the partial vapor pressures of the two metals above the alloy are in the required ratio (the proportion of each of the constituent oxides of the resulting mixed-oxide coating being in fact substantially proportional to the partial vapor pressure of each of the metals above the alloy). According to Raoult's Law, the ratio of the vapor pressures $p_A$ and $p_B$ of two metals A and B above the alloy AB for a specified temperature T is given by the relationship:

$$(p_A p_B) = (x_A/x_B) \cdot (p_A^*/p_B^*) \cdot \sqrt{(M_B/M_A)}$$

where $x_A$ and $x_B$ are the molar fractions of the metals A and B in the alloy, $p_A^*$ and $P_B^*$ are the vapor pressures of the pure metals A and B at the temperature T, and $M_A$ and $M_B$ are the atomic masses of these metals (the variation of vapor pressure $p^*$ with the temperature T is given in the literature in the form of tables). It is therefore always possible to determine a composition for the initial alloy which, at the evaporation temperature chosen to give a selected evaporation rate, enables a mixed-oxide coating of desired composition to be obtained. This alloy is heated to the chosen evaporation temperature by an electron gun, the exact measurement of this evaporation temperature being made by thermocouple placed in contact with the alloy (as by traversing the wall of the crucible containing the alloy). Assume for example that a mixed coating of indium and tin oxides is to be deposited. If one chooses an alloy of 90% Sn and 10% In and an evaporation temperature of 1080° C (the vapor pressure at this temperature for pure In being $10^{-1}$ torr, for pure Sn $10^{-3}$ torr, and the partial pressures above the alloy being $10^{-2}$ and $0.9 \cdot 10^{-3}$ torr respectively), a mixed oxide coating is obtained comprising 85 mole-% of $In_2O_3$ and 15 mole-% of $SnO_2$.

In the case of two separate sources of evaporation, each consisting of a pure metal, it is convenient to choose an evaporation temperature for each of the sources such that the vapor pressures of these sources are in the required ratio to give a mixed-oxide coating of desired composition (the proportions of each of the constituent oxides of this coating being in fact substantially proportional to the vapor pressures of the sources). Assume, again, that a mixed coating of indium and tin oxides is to be deposited. By choosing a source of indium heated to 950° C and a source of tin heated to 1100° C (the vapor pressures of indium and tin being then $10^{-2}$ torr and $10^{-3}$ torr respectively), a mixed-oxide coating is obtained comprising 83 mole-% of $In_2O_3$ and 17 mole-% of $SnO_2$. The temperature of each of these sources may be determined precisely by thermocouples placed in contact with the sources. The sources may be heated by two independent guns whose beams are respectively focused on each of the sources. The heating may also be effected by a single gun equipped with deflection means capable of causing the two crucibles containing the sources to be sequentially scanned by the beam, the sequence duration being controlled in such a manner as to obtain the temperatures which give the required vapor-pressure ratio (this could for example be obtained by so adjusting the rectangular signal supplying the deflection coils that the time for which the beam stops on one crucible is greater than the time for which it stops on the other).

By precisely controlling the temperature of the liquid metal or metals in the source, the rate of deposition is also controlled. If the rate of evaporation of the metals is calculable from the vapor pressure at the given temperature, the rate of growth of the deposit may be estimated approximately from the geometrical data. The exact value is determined experimentally for each case. The essential fact is that of being able to ensure a constant rate by keeping the source temperature constant. In this particular case, in which the metals vaporize at relatively low temperatures (900°-1100° C), measurement is easy by thermocouples.

I have pointed out above that known recharging systems are difficult to apply in the case of metals such as indium, antimony or tin or their alloys, because their melting point is far removed from the evaporation temperature. A particularly advantageous method in this case, taking account of the low melting point of these elements, is to provide evaporation sources whose liquid level is kept constant by the principle of communicating vessels. To this end, the evaporation crucible communicates, through a pipe kept at a temperature higher than the melting point of the metal to be evaporated, with a supply container filled with the metal, which is also heated to keep the metal in the liquid state. The supply container may be installed in the vacuum enclosure at the same level as the evaporation crucible, or may be placed outside the enclosure at ambient pressure in which case this container must be disposed at a level which differs sufficiently from that of the evaporation crucible to compensate for the pressure difference of one atmosphere.

A recharging system of this type is evidently not limited exclusively to the process of the invention, but can have a much wider field of application. Such a system could in fact be applied to continuously feeding practically any source of evaporation of relatively low melting point.

During reactive deposition, it is important to keep the oxygen pressure constant and not to exceed the maximum metal-evaporation rate, so that stoichiometric depositing is obtained. It is easy to keep the oxygen pressure constant by using inlet valves controlled by a vacuum gauge.

Substrate preheating, usually included in methods for depositing thin coatings to ensure good adherence of the deposit, is here superfluous because of the intense bombardment of the substrate by ions of the gaseous plasma and of the coating substance.

The essential function of the metal grid in the vicinity of the insulating substrate is to enable the glow discharge to become established uniformly around the substrate before any deposition of the conducting oxide coating, so that deposition can begin under optimum conditions. Thus, it is well known in all coating techniques that the stage of commencement of deposition is the most important, this stage being in fact directly responsible for the quality of the substrate/coating interface obtained. As the substrate surface becomes progressively conductive with deposition of the oxide coating, it is desirable that this coating be connected electrically in one manner or another to the grid so that it may be brought to the same negative potential as this latter. The may be achieved for example by disposing a metal band on one of the edges of the substrate and providing an electrical contact between this band and the grid. This metal grid (and thus the facility deriving therefrom of being able to establish the glow discharge prior to any deposition) also enables the substrate to be ionically cleaned prior to any deposition.

However, the presence of such a grid gives rise to the risk of a deformation of the oxide deposit on the substrate due to the shadow effect of the grid wires, and the effect of ion deflection by the electrical field created by these same wires. Thus in order to make this impression disappear, it is highly desirable to move either the grid or the substrate during the deposition period. This is notably the case during continuous deposition, where the substrates file past the source and the grid remains immobile.

To improve the optical transmissivity of the conducting coatings thus obtained, the ionic deposition may be advantageously followed by annealing in air. This annealing is carried out at temperatures of the order of 300–400° C, for times of the order of 10 to 60 mins.

Brief Description of the Drawing

Several embodiments of an apparatus for carrying out the process according to the present invention are shown in the accompanying drawing in which.

Specific Description

Figure 1:
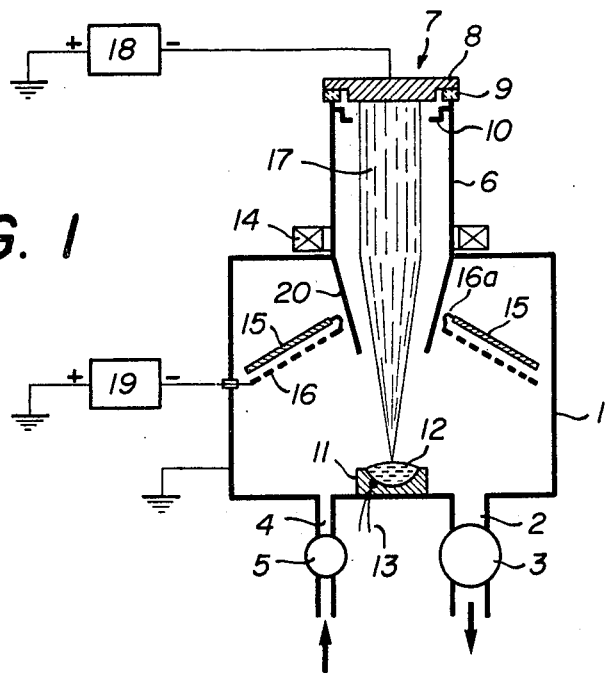
FIG. 1 is a diagrammatic sectional view of a first embodiment of my invention

The apparatus shown in FIG. 1 comprises a sealed metal enclosure 1 provided with an evacuation port 2, connected via a valve 3 to a suitable pumping device (not shown), and an admission port 4 connected by a gauged valve 5 to a source of pure oxygen (not shown). A tubular conduit 6 is connected to the top of the enclosure 1, and a glow discharge electron gun 7 is disposed at its free end. The gun 7 comprises essentially a cylindrical aluminum cathode 8 isolated electrically from the conduit 6 by an insulating ring 9 and cooled by suitable means (not shown), and an annular metal diaphragm 10 connected electrically to the conduit 6 to act as an anode separated from the cathode by an annular gap. An electron beam 17 is emitted by a face of cathode 8 over an area unobstructed by ring 10. The metal enclosure 1 is connected to ground while the cathode 8 is connected to the negative pole of a high-voltage source 18 whose other pole is also grounded whereby an ionizing field is set up across the interelectrode gap. On the base of the enclosure 1, in line with the gun 7, there is disposed a graphite crucible 11 filled with an indium and tin or antimony alloy 12. The crucible 11 is traversed by a thermocouple 13 having an end in contact with the alloy 12. Around the tubular conduit 6 there is disposed a focusing coil 14 serving to focus the vertical electron beam 17 onto the evaporation surface of the crucible 11. A plurality of glass substrates 15 are placed in the enclosure 1 above the crucible 11 all about the beam 17 (only two of these substrates are shown in the drawing). Below the substrates 15 there is disposed a metal grid 16 of frustoconical shape, electrically insulated from the enclosure and connected to the negative pole of a high-voltage source 19 whose the positive pole is connected to ground. Between the grid 16 and beam 17 there is disposed a frustoconical metal partition 20 designed to prevent any interaction between the grid potential and the electron beam. The insulating substrates 15 are also connected electrically by one of their edges to the metal grid 16 by way of wires 16a (these edges may for example comprise a metal band, not shown in the drawing).

As the principle of reactive-ion plating is known, only a brief description of the operation of this apparatus will be given. When the enclosure has been evacuated, an oxygen atmosphere at a pressure of the order of $10^{-3}$ to $10^{-2}$ torr is introduced therein, and negative high voltages are applied to the cathode 8 of the gun 7 and to the grid 16. The negative biasing of the cathode 8 produces in the neighborhood thereof a glow discharge which causes partial ionization (and activation) of the oxygen atoms. The oxygen ions bombard the cathode 8, which emits a beam of secondary electrons 17 directed onto the alloy 12, which evaporates. The metal vapour thus formed then moves toward the substrates 15 while becoming activated (ionized or energized) by the beam 12 when it intersects its trajectory (the beam 12 also causes activation of the oxygen molecules encountered in its trajectory). The glow discharge generated by the biasing of the grid causes an increase in the activity of the metal-vapor and oxygen particles, and an acceleration in the direction of the substrate of those of the particles which are in the ionized state, so that all these activated particles interact to form a mixed-oxide coating deposited on the surface of the glass substrates 15.

Figure 2:
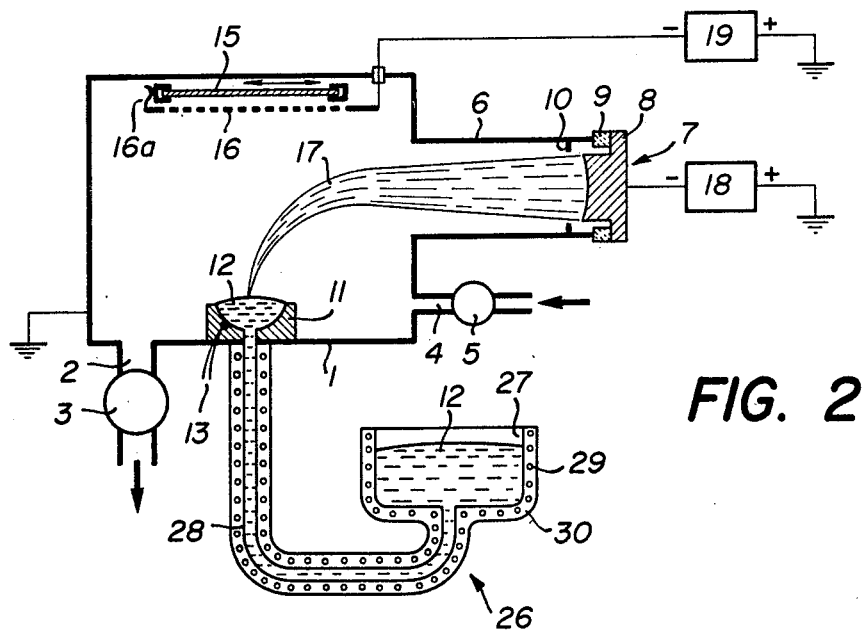
FIG. 2 is a view analogous to FIG. 1 of a modification showing this embodiment and FIG. 3 is a diagrammatic sectional view of a second embodiment.

In the modification shown in FIG. 2, the glass substrate or substrates 15 are disposed horizontally above the crucible 11 containing the alloy 12 to be evaporated, while the tubular conduit 6, at the free end of which is mounted the discharge gun 7, opens laterally into the enclosure 1. As the cathode 8 used in this modification is of concave profile, the focusing coils are here superfluous. Only a deflection coil is provided (not shown in the drawing), the purpose of which is to bend the horizontal electron beam 17 so that its end strikes the evaporation surface of the crucible 11. The crucible 11 is fitted with a continuous feed system 26 comprising a supply container 27 disposed outside the enclosure 1 and connected to the crucible 11 by a conduit 28 traversing the base of the enclosure in a sealed manner. A heating jacket 29 covered with thermal insulation 30 is disposed about the container 27 and conduit 28. The container 27, which keeps the alloy 12 to be evaporated in the liquid state by the heating jacket 27, is placed at a level sufficiently below that of the crucible 11 to compensate for the pressure difference of 1 atmosphere.

The apparatus of FIGS. 1 and 2 may be modified in various ways. Thus, as previously mentioned, I may use two independent crucibles respectively filled with indium and with tin or antimony, or tin and cadmium, instead of using a single crucible containing an alloy of these metals. The metals in the two crucibles may be evaporated by two independent guns, or by a single gun sequentially scanning the two crucibles. Each of the crucibles may also be fitted with its own continuous feed system. The aforementioned relative motion of substrate 15 and grid 16 has been indicated in FIG. 2 by a double-headed arrow.

Figure 3:
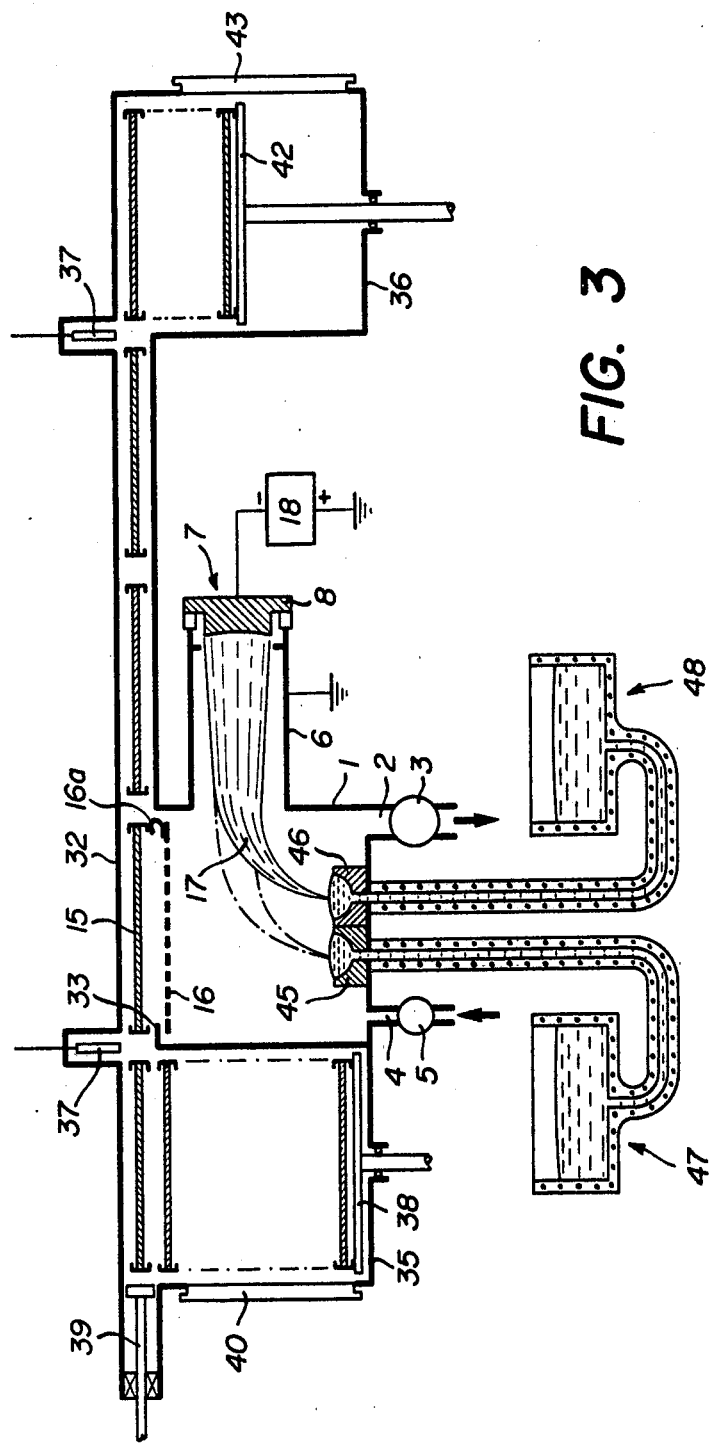

FIG. 3 shows an installation for continuously coating large-area transparent substrates, for example vehicle windows. This installation again comprises a sealed enclosure 1 provided with an evacuation port 2 and an oxygen inlet port 4. Above the enclosure 1 there is disposed a tunnel 32, connected to the enclosure 1 by an aperture 33, the area of which is substantially equal to the area of the windows 15 to be coated (these windows being shown on the drawing width-wise). A metal grid 16 spans the aperture 33, in line with the windows 15 to be coated which file past that grid one after the other. The tunnel 32 is connected by its two ends to an inlet lock chamber 35 and an outlet lock chamber 36, respectively, from which it may be tightly isolated by removable partitions 37. The inlet lock chamber 35 is fitted with a device for continuously feeding the tunnel 32 with windows 15 to be coated. This feed device is represented diagrammatically in the drawing by an elevator platform 38 supporting a stack of windows 15 to be coated, its purpose being to sequentially bring each of the windows in front of the inlet to the tunnel 32, and by a horizontal feed mechanism 39, the purpose of which is to ensure the progression of each of the windows in the tunnel. The inlet lock chamber 35 also comprises a loading door 40 through which the stack of windows to stack coated may be introduced (the stock being shown only partially in the drawing). The outlet door 36 is fitted with a device for successively receiving the coated windows as they leave the tunnel 32. This receiving device is represented diagrammatically on the drawing by an elevator platform 42, driven with descending motion, on which the coated windows 15 are progressively piled. The outlet lock chamber 36 is also fitted with a discharge door 43 through which the coated windows may be removed. The inlet and outlet lock chambers 35 and 36 are fitted with pumping units (not shown) designed to produce a vacuum in the lock chambers after the loading and discharge operations, and before they are connected to the tunnel 32 and enclosure 1.

Two longitudinal crucibles 45 and 46, shown in cross-section rest side by side on the bottom of the enclosure 1; they may be filled one with indium and the other with tin or antimony, or one with tin and the other with cadmium. The length of the crucibles is substantially equal to the length of the windows to be coated. The crucibles 45 and 46 are each fitted with a continuous feed system analogous to that of FIG. 2, namely a first feed system 47 for the crucible 45 and a second feed system 48 for the crucible 46.

Finally, the enclosure 1 is fitted with a bank of discharge guns 7 disposed at the free end of a conduit 6 laterally connected to the enclosure 1. This bank of guns 7 is disposed parallel to the longitudinal direction of the crucibles 45 and 46 (this direction being perpendicular to the plane of the drawing, only one of the guns 7 being shown in the figure). Deflection coils (not shown in the drawing) are supplied in such a manner that the bank of guns 7 sequentially scans the crucibles 45 and 46, the times for which the beams 17 emitted by the guns 7 stop over each crucible being so chosen that each of the crucibles is brought to the appropriate temperature. The various cathodes 8 of the discharge guns 7 and the biasing grid 16 are connected to negative high-voltage sources.

The operation of this installation is analogous to that of the aforedescribed embodiment, the main difference being that the substrates to be coated file past continuously in line with the evaporation sources instead of remaining immobile as previously. It is also apparent that the speed at which the substrates file past may be doubled (or tripled, quadrupled etc.) by installing a second (or third, fourth etc.) vapor source in the evaporation chamber, heated by a second bank of guns.

EXAMPLE 1

A graphite crucible containing an alloy of 90% Sn and 10% In, the alloy having an evaporation area of 1 cm$^2$, is disposed in an enclosure analogous to that of FIG. 1. The oxygen pressure in the enclosure is kept at $6.10^{-3}$ torr. The glass substrates are placed at 1 cm from the grids, and these latter are distant 18 cm from the crucible and are biased at to $-1.5$ kV. The alloy is heated by a glow-discharge gun. The voltage applied to the gun cathode is 6 kV and the current drawn is of 130 mA. The energy concentrated on the crucible is adjusted by focusing the beam in such a manner that the evaporation temperature of the alloy (measured at the thermocouple) reaches 1080° C. The oxide mixture deposits on the glass plates. The deposition time is 90 seconds. The mixed oxide coating so obtained has the following characteristics:

Thickness: 1200 A
Specific resistivity: $3.3 \times 10^{-4}$ Ω.cm, i.e. a squared resistance of 28Ω.

It is then annealed in air for 30 min. at 325° C. The specific resistivity remains unchanged. Transmissivity in the visible spectrum is 86% (including losses by reflection from the substrate). The coating obtained is very hard (harder than glass) and very adherent.

EXAMPLE 2

Two crucibles filled respectively with pure indium and pure tin are disposed in an enclosure analogous to those of FIGS. 1 and 2, the evaporation surfaces of each crucible being 100 cm$^2$. The oxygen pressure in the enclosure is kept at $6 \times 10^{-3}$ torr. The glass substrates are placed 30 cm from the crucibles. The sources of evaporation are heated by two independent discharge guns. The energy from each of the guns is adjusted so that the indium source is kept at a temperature of 950° C and the tin source is kept at a temperature of 1110° C (temperatures measured at the thermocouple). The deposition rate on the substrates is of the order of 25 A/sec. The deposition time is 50 seconds. A coating of 1250 A thickness is obtained on the glass, of slightly brown color (transmissivity 60-70%).

After annealing in air for 15 min. at 350° C, the coating becomes totally transparent and its resistivity stabilizes at $4.10^{-4}\Omega cm$, ie a squared resistance of 30Ω. The transmissivity is at 550 nanometers (slight green-blue interference coloration in the transmitted light). The coating obtained has excellent hardness and adherence characteristics.

EXAMPLE 3

Two crucibles filled respectively with indium and tin are disposed in an installation analogous to that of FIG. 3. The oxygen pressure in the enclosure is kept at $6.10^{-3}$ torr. A row of magnetically deflected discharge guns (disposed perpendicular to the plane of the drawing) sequentially scans the two crucibles. The rectangular signal supplying the deflection coils is adjusted so that the time for which the beams stop over the Sn is greater than that over the In. These stopping times are chosen so that the indium is kept at a temperature of 950° C and the tin at a temperature of 1100° C. In this way the same vapor composition and the same evaporation rate are obtained as in Example 2.

The glass substrates file past behind the metal grid biased at $-1$ kV at a speed of 0.6 cm/sec and then traverse the evaporation region, of 30 cm, in 50 seconds. The resultant coating is identical with that obtained in Example 2.

EXAMPLE 4

The apparatus used is identical with that described in Example 2, with the difference that the crucible filled with pure indium is in this case replaced by a crucible filled with pure cadmium, the crucible filled with tin remaining the same. The oxygen pressure in the enclosure is kept at $6.10^{-3}$ torr. The evaporation sources are heated by two independent discharge guns, and the energy from each of the guns is adjusted so that twice as much cadmium condenses on the glass substrates as tin. A coating of cadmium stannate, $Cd_2SnO_4$, thus condenses on the substrates. The deposition rate is of the order of 25 A/sec and the depositing time is 50 seconds.

After annealing in air, a conducting coating is obtained with a transmissivity exceeding 86% and an electrical conductivity exceeding $10^4\Omega^{-1}.cm^{-1}$ at a temperature of 25° C.

EXAMPLE 5

The apparatus used is identical with that described in Example 1. The working method followed is also similar to that followed in Example 1, with the difference that no biasing voltage is applied to the grid (thus no glow discharge appears). The coating obtained after deposition is less transparent and of poor hardness (it consists of a pulverulent layer which may easily be scratched with the finger nail). If this coating is annealed, its transparency is improved but there is virtually no change in hardness.

Thus the process according to the invention allows conductive mixed-oxide coatings to be deposited continuously on large-area transparent substrates at high deposition rates, the coatings being of low electrical resistivity and excellent optical transmissivity.

I claim:

1. A process for coating an insulating substrate with an oxide of at least one metal by reactive-ion plating, comprising the steps of:
    disposing a source of a vaporizable metallic mass in a sealed enclosure;
    maintaining in said enclosure a rarefied oxygen atmosphere at a pressure capable of sustaining a glow dishcarge;
    training at least one electron beam upon said source to vaporize said metallic mass;
    disposing a substrate to be coated in said enclosure at a location spaced from the origin of said electron beam and remote from said source;
    interposing a conductive grid within said enclosure between said location and said source in proximity to said substrate; and
    negatively biasing said grid with reference to said source with a voltage sufficient to develop a glow discharge therebetween for ionizing, jointly with said beam, part of the metal vapors emitted by said source and part of the oxygen of said atmosphere with acceleration of the interacting metal-vapor and oxygen ions toward said substrate to deposit thereon a resulting oxide.

2. A process as defined in claim 1 wherein said electron beam is generated by negatively biasing a cold cathode with reference to a surrounding anode, which forms part of said enclosure and is held at the same potential as said source, for generating a glow discharge in the vicinity of said cathode to bombard same with oxygen ions stimulating the emission of electrons therefrom.

3. A process as defined in claim 2 wherein said cathode is located outside the region of the glow discharge occurring between said grid and said source, said beam being convergingly guided through said region in a terminal part of its trajectory.

4. A process as defined in claim 1 wherein said gas pressure ranges between substantially $10^{-3}$ and $10^{-2}$ torr.

5. A process as defined in claim 1 wherein said metallic mass includes two metals vaporized concurrently with resulting mixing of their oxides in the deposit formed on said substrate.

6. A process as defined in claim 5 wherein one of said metals is indium and the other of said metals is selected from the group which consists of tin and antimony, said substrate being transparent.

7. A process as defined in claim 5 wherein one of said metals is cadmium and the other of said metals is tin, said substrate being transparent.

8. A process as defined in claim 5 wherein said metals are alloyed with each other in a crucible constituting said source.

9. A process as defined in claim 5 wherein said source includes two juxtaposed crucibles respectively containing said metals which are alternately heated by a common electron beam sweeping thereacross.

10. A process as defined in claim 5 wherein said source includes two crucibles respectively containing said metals which are simultaneously heated by separate electron beams.

11. A process as defined in claim 1 wherein said metallic mass has a melting point substantially below its vaporization temperature, comprising the further step of keeping said metallic mass liquid in a crucible constituting said source.

12. A process as defined in claim 11 wherein said metallic mass is gravity-fed to said crucible in its liquid state from a heated open supply container disposed outside said enclosure at a level sufficiently lower than that of said crucible to compensate for the difference in ambient pressures reigning at said crucible and at said container.

13. A process as defined in claim 1, comprising the further step of annealing the substrate coated with said oxide by heating same to air.

14. A process as defined in claim 1, comprising the further step of relatively displacing said substrate and said grid during deposition of said oxide to prevent a deformation of the deposit by a grid shadow.

* * * * *